United States Patent
von Koblinski et al.

(10) Patent No.: US 11,756,917 B2
(45) Date of Patent: Sep. 12, 2023

(54) METHOD FOR PROCESSING A SEMICONDUCTOR WAFER, SEMICONDUCTOR WAFER, CLIP AND SEMICONDUCTOR DEVICE

(71) Applicant: Infineon Technologies Austria AG, Villach (AT)

(72) Inventors: Carsten von Koblinski, Villach (AT); Daniel Pedone, Munich (DE); Matteo Piccin, Villach (AT); Roland Rupp, Lauf (DE); Chiew Li Tai, Melaka (MY); Jia Yi Wong, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 71 days.

(21) Appl. No.: 17/202,990

(22) Filed: Mar. 16, 2021

(65) Prior Publication Data

US 2021/0305198 A1  Sep. 30, 2021

(30) Foreign Application Priority Data

Mar. 26, 2020 (EP) .................................... 20165985

(51) Int. Cl.
  *H01L 23/00* (2006.01)
(52) U.S. Cl.
  CPC .............. *H01L 24/37* (2013.01); *H01L 24/29* (2013.01); *H01L 24/73* (2013.01); *H01L 24/83* (2013.01);
  (Continued)
(58) Field of Classification Search
  CPC ..... H01L 21/77; H01L 21/78; H01L 21/7806; H01L 21/782; H01L 21/48;
  (Continued)

(56) References Cited

U.S. PATENT DOCUMENTS

| 2012/0088351 A1* | 4/2012 | Tauzin | ............. H01L 21/76259 |
| | | | 257/E21.568 |
| 2013/0228905 A1* | 9/2013 | von Koblinski | ........ H01L 24/05 |
| | | | 257/668 |

(Continued)

FOREIGN PATENT DOCUMENTS

| JP | 2010010173 A | 1/2010 |
| KR | 20120128038 A | 11/2012 |
| WO | 2018211681 A1 | 11/2018 |

*Primary Examiner* — Julio J Maldonado
*Assistant Examiner* — Stanetta D Isaac
(74) *Attorney, Agent, or Firm* — Murphy, Bilak & Homiller, PLLC

(57) ABSTRACT

A method for processing a semiconductor wafer is provided. A semiconductor wafer includes a first main surface and a second main surface. Defects are generated inside the semiconductor wafer to define a detachment plane parallel to the first main surface. Processing the first main surface defines a plurality of electronic semiconductor components. A glass structure is provided which includes a plurality of openings. The glass structure is attached to the processed first main surface, each of the plurality of openings leaving a respective area of the plurality of electronic semiconductor components uncovered. A polymer layer is applied to the second main surface and the semiconductor wafer is split into a semiconductor slice and a remaining semiconductor wafer by cooling the polymer layer beneath its glass transition temperature along the detachment plane. The semiconductor slice includes the plurality of electronic semiconductor components.

16 Claims, 8 Drawing Sheets

(52) U.S. Cl.
CPC .............. *H01L 24/84* (2013.01); *H01L 24/94* (2013.01); *H01L 2224/29021* (2013.01); *H01L 2224/3702* (2013.01); *H01L 2224/37012* (2013.01); *H01L 2224/73213* (2013.01); *H01L 2224/83851* (2013.01); *H01L 2224/84345* (2013.01)

(58) Field of Classification Search
CPC . H01L 21/4878; H01L 21/4896; H01L 21/50; H01L 21/52; H01L 21/568; H01L 2221/68304; H01L 2221/6834; H01L 2221/6835; H01L 2221/68363; H01L 2221/68368; H01L 2221/68381; H01L 2221/68386
See application file for complete search history.

(56) References Cited

U.S. PATENT DOCUMENTS

| | | |
|---|---|---|
| 2017/0207124 A1 | 7/2017 | Rupp et al. |
| 2018/0158720 A1 | 6/2018 | Hu |

\* cited by examiner

METHOD FOR PROCESSING A SEMICONDUCTOR WAFER, SEMICONDUCTOR WAFER, CLIP AND SEMICONDUCTOR DEVICE

TECHNICAL FIELD

This disclosure relates in general to a method for processing a semiconductor wafer. It further relates to a semiconductor wafer and a semiconductor device. This disclosure further relates to a clip for electrically connecting a pad arranged on the semiconductor wafer.

BACKGROUND

In order to improve characteristics of semiconductor devices the final thickness of semiconductor material in the device is often reduced. Especially for vertical power devices the final thickness influences the electrical characteristics.

Thinning the semiconductor wafer may be performed by etching, grinding, sawing etc. These removal processes may be time consuming or resource intensive. Another way of thinning may be splitting the wafer.

Handling of thin wafers is complicated. Brittle semiconductor material is prone to break once thinned Semiconductor wafers to be thinned and already thinned semiconductor wafers may be mounted on carriers for secure handling.

With the thinned semiconductor wafer arranged on a carrier it is not possible to electrically contact both sides of the wafer. Measurement of electrical characteristics of vertical devices having electrical contacts on both sides is then not possible on wafer level.

Lateral dimensions of semiconductor devices also tend to decrease. Smaller lateral dimensions lead to smaller pads which must be electrically connected. On the other hand electrical connectors connecting power devices may require a cross section sufficiently large to allow high current to flow.

SUMMARY

An example relates to a method for processing a semiconductor wafer. The method provides a semiconductor wafer with a first main surface and a second main surface opposite the first main surface. Inside the semiconductor wafer defects are generated. The defects define a detachment plane parallel to the first main surface. According to the method, the first main surface is processed to define a plurality of electronic semiconductor components. The method further provides a glass structure. The glass structure has a plurality of openings. The glass structure is attached to the processed first main surface. Each of the plurality of openings leaves an area of the plurality of electronic semiconductor components uncovered. A polymer layer is applied to the second main surface. The method splits the semiconductor wafer into a semiconductor slice and a remaining semiconductor wafer by cooling the polymer layer beneath its glass transition temperature. The semiconductor slice extends between the first main surface and the detachment plane. The semiconductor slice comprises the plurality of electronic semiconductor components.

An example relates to a semiconductor wafer. The semiconductor wafer has a first main surface and a second main surface opposite the first main surface. A detachment plane defined by defects lies inside the semiconductor wafer. The detachment plane is parallel to the first main surface. A plurality of electronic semiconductor components is formed at the first main surface and between the first main surface and the detachment plane. A glass structure is attached to the first main surface. The glass structure comprises a plurality of openings. Each of the plurality of openings leaves a respective area of the plurality of electronic semiconductor components uncovered.

An example relates to a clip for electrically connecting a pad arranged on a bottom of an opening in a glass structure. The clip comprises either a rivet forming a first portion of the clip, the rivet riveted to a second portion of the clip or a single piece of metal sheet bent to form both a first and a second portion. The second portion is structured to extend to a terminal. The first portion has a width about half of the width of the opening or greater. The first portion is structured to extend straight to the bottom of the opening.

An example relates to a semiconductor device. The semiconductor device comprises a semiconductor chip with a first main surface and a second main surface opposite the first main surface. The first main surface comprises a pad and a glass structure. The glass structure comprises an opening. A rim of the opening surrounds the pad. An aspect ratio between a thickness of the glass structure surrounding the opening and a width of the opening is equal to one to three or greater. The semiconductor device comprises a carrier on which the semiconductor chip is mounted. The second main surface of the semiconductor chip faces the carrier. An adhesive is on a bottom of the opening. A clip electrically connects the pad. The clip comprises either a rivet forming a first portion of the clip with the rivet riveted to a second portion of the clip, or a single piece bent to form both a first and a second portion. The second portion is structured to extend to a terminal on the carrier. The first portion has a width about half of the width of the opening or greater. The first portion is structured to extend straight to the bottom of the opening. The first portion of the clip is electrically connected to the pad by means of the adhesive.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

Figure 1A:
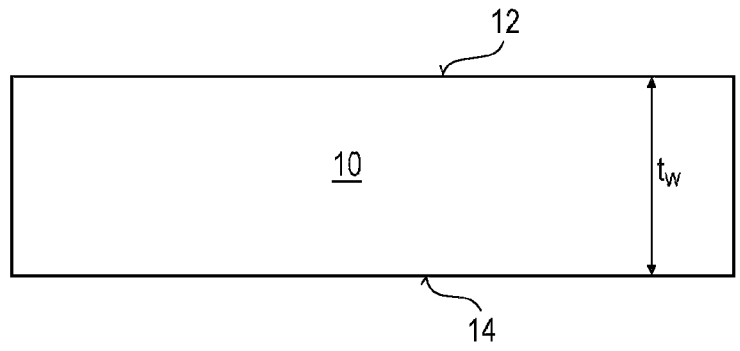
FIGS. 1A-1H are conceptual diagrams illustrating an example method for processing a semiconductor wafer according to an example.

In the following, examples are described with reference to the drawings wherein like reference numerals are generally utilized to refer to like elements throughout. In the following description, for purposes of explanation, numerous specific details are set forth in order to provide a thorough understanding of one or more aspects of examples. However, it may be evident to a person skilled in the art that one or more aspects of the examples may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or examples are merely examples and that other aspects and/or examples may be utilized and structural and functional modifications may be made without departing from the scope of the present disclosure. In addition, while a particular feature or aspect of an example may be disclosed with respect to only one of several implementations, such feature or aspect may be combined with one or more other features or aspects of the other implementations as it may be desired and advantageous for any given or particular application. Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal.

Examples described herein may relate to a semiconductor wafer. A semiconductor wafer may comprise any kind of semiconductor material. A semiconductor wafer may comprise a specific semiconductor material, for example Si, SiC, SiGe, GaAs, GaN, or any other semiconductor material. A semiconductor wafer may have a circular form. A diameter of a circular semiconductor wafer may be of about 110 mm, 150 mm, 200 mm, 300 mm or 450 mm. The diameter of a circular semiconductor wafer may be of any other value. A semiconductor wafer may have a rectangular form. A semiconductor wafer may have a square form. A semiconductor wafer may be from SiC with a diameter of 150 mm A thickness of a semiconductor wafer may be between about 200 μm and about 700 μm. A thickness of a semiconductor wafer may be about 350 μm or about 500 μm.

Aspects of described examples may comprise generating defects inside a semiconductor wafer. Defects may be generated by means of at least one radiation source. The radiation source may be a laser. The radiation source may be a femtosecond laser. The defects generated inside the semiconductor wafer may determine a detachment plane parallel to a surface of the semiconductor wafer. The detachment layer or defect layer may manage or direct a crack propagation. A stress to the semiconductor wafer may start a crack propagation. Exposing the wafer to rays of a radiation source may create in a first step a type of perforation within the semiconductor wafer along which, in a second step, a crack propagation takes place. Forming a defect layer and initiating a crack propagation may allow to split a thin slice from a semiconductor wafer. In other words: The defect layer can be e.g. introduced by a laser-process to weaken the substrate in a desired depth and a subsequent process is used to split the substrate along this defect layer. This can be obtained by applying thermal (cold/hot gradient) or mechanical (e.g. ultrasonic) force. A thickness of a split slice may be smaller than 200 μm or smaller than 100 μm or smaller than 80 μm or smaller than 60 μm or smaller than 40 μm or smaller than 20 μm. In examples the thickness of the slice may be comprised between about 30 to 50 μm.

Examples described herein may comprise electronic semiconductor components processed on a surface of a semiconductor wafer. An electronic semiconductor component may be a semiconductor device which is at least partially processed. The electronic semiconductor component may be processed or partially processed in and on the semiconductor wafer. Partially processed may indicate that the semiconductor device is not fully completed. Further processes such as formation of doping regions, contact regions, metallization or dicing may still be needed to obtain an operable semiconductor device. The semiconductor device may be at least a two-terminal device, an example is a diode. The semiconductor device can also be a three-terminal device such as a field-effect transistor (FET), insulated gate bipolar transistor (IGBT), junction field effect transistors (JFET), and thyristors to name few. The semiconductor device can also include more than three terminals. The semiconductor device may be a vertical device. The electronic components formed on the semiconductor wafer may be separated by kerf lines.

Examples disclosed herein may comprise a glass structure. A thickness of the glass structure may be comprised between about 100 μm and 700 μm or between about 400 μm and 600 μm. A thickness of the bars may be about 500 μm. A thickness of the bars may be comprised between about 150 μm and 190 μm. The glass structure may comprise any suitable glass material such as pure quartz or any type of float glasses. The glass structure may have a plurality of openings. Lateral dimensions of the openings or one out of the openings may be adapted to lateral dimensions of the semiconductor devices or the semiconductor components. Lateral dimensions of the openings or one out of the openings may be adapted to lateral dimensions of contact pads on a surface of the semiconductor components or semiconductor devices. A lateral width of an opening may be less than 2 mm, or less than 1.5 mm or less than 1 mm A lateral width of an opening may be about 1 mm A lateral width of an opening may be about 1.2 mm. The area of the opening may be less than 3 mm$^2$ or less than 2.5 mm$^2$ or less than 2 mm$^2$ or less than 1.5 mm$^2$. The area of the opening may be 1.1×1.2 mm$^2$. The opening may be rectangular. The glass structure may be a glass grid. The glass grid may be a regular glass grid. The openings of the glass grid may be separated by bars. A lateral width of the bars may be comprised between about 100 μm and 200 μm. A lateral width of the bars may be about 155 μm. The bars may form rims around the openings. A distance of the bars may be adapted to a distance of the kerf lines on the semiconductor wafer. A thickness of the bars may be comprised between about 300 μm and 700 μm or between about 400 μm and 600 μm. A thickness of the bars may be about 500 μm. An aspect ratio between the thickness of the glass structure surrounding the opening, i.e. the bars and a width of the openings may be about 1:3 or about 1:2.5 or 1:2 or greater, the aspect ratio may be up to 1:1 or even greater with a thickness of the glass structure greater than the width of the opening. A thickness of the bars may be about 500 μm while a width of the openings may be between about 1 mm and 1.2 mm.

The glass structures described herein may be formed by an etching process which may be a wet etch process. The etching process may comprise forming a mask using lithography on both sides of a glass wafer. Once the masks formed on the surfaces of the glass wafer, the glass wafer may be etched from both surfaces to a depth of about half of the glass wafer from each side to obtain the openings. The glass structures described herein may be formed by a laser induced deep etching (LIDE) process. In a LIDE process the openings are formed in a two-step process. First a glass surface is irradiated by laser pulses producing line shaped modifications traversing the whole glass thickness. Subsequently a wet etch is performed enlarging the laser pulse induced micro perforations.

The glass structure described above may be attached to the processed first main surface of the semiconductor wafer. The glass structure may be attached permanently or in other words irreversibly to the semiconductor wafer. The glass structure may be attached using a polymer adhesive. The glass structure may be attached using an epoxy resin. The glass structure may be attached using a ceramic adhesive. The glass structure may be attached using a glass solder. The glass structure may be attached using anodic bonding, glass-fit bonding or fusion bonding. The glass structure may be attached using any other method providing a permanent connection to the semiconductor wafer. The permanent connection may be adapted to a wide temperature range. The permanent connection may withstand temperatures as high as 300° C. or even higher and as low as −170° C. or even lower.

The glass structure may be arranged relative to the semiconductor wafer such that the plurality of openings in the glass structure leaves each an area of the plurality of electronic semiconductor components uncovered. The glass structure may be arranged relative to the semiconductor wafer such that the bars of the glass structure overlay the kerf lines of the semiconductor wafer. The glass structure may comprise two or more openings per semiconductor component. Two openings per semiconductor component may allow having a control pad and a power pad of the semiconductor component uncovered. The control pad may provide an electrical connection to a gate of a field effect transistor or to a base of a bipolar transistor. The power pad may provide an electrical connection to a source or drain of a field effect transistor or to an emitter or a collector of a bipolar transistor. The openings may be sized to be smaller than the size of the final semiconductor chip.

Examples described herein may comprise applying a polymer layer to the second main surface of the semiconductor wafer. The polymer layer may be adapted to induce a stress to the semiconductor wafer when cooled down. Examples may comprise applying a sacrificial layer to the second main surface of the semiconductor wafer prior to apply the polymer layer. Examples described herein may comprise applying a polymer layer with or without an intermediate sacrificial layer to the first main surface of the semiconductor wafer. Examples described herein may comprise cooling the polymer layer beneath its glass transition temperature. Cooling may comprise rapidly cooling down. Cooling down the polymer layer may induce stress to the semiconductor wafer and lead to splitting a semiconductor slice from the semiconductor wafer along a predefined detachment layer.

Examples disclosed herein may comprise dicing the semiconductor slice with the permanently attached glass structure along the kerf lines into semiconductor chips. Dividing or dicing may be effectuated as usual by scribe-and-break, laser cutting, sawing or any other method. With the bars of the glass structure arranged along the kerf lines, the glass structure may be cut at the same time. The bars of the glass structure may be sufficiently large to leave a rim surrounding the openings on each semiconductor chip. The rims may provide stability to the thin semiconductor chip. The rims may provide a high-voltage protection.

Examples described herein may comprise a clip for electrically connecting a pad arranged on a bottom of an opening in a glass structure. A clip may provide a cross section sufficiently large to conduct a high current as handled by the semiconductor device. A high current to be conducted may be higher than 5 A, higher than 6 A, or higher than 7 A or higher. A required current may be about 6.9 A. A required cross section area may be greater than 800 µm², 900 µm² or 1000 µm² or greater.

A clip as described herein may comprise copper. A clip described herein may be of any other electrically conductive material. A clip may comprise a first portion to extend to the bottom of the opening of the glass structure. The first portion may be formed by a rivet. The rivet may have a circular cross section. A diameter of the rivet may be greater than 200 µm, greater than 300 µm, greater than 500 µm or greater. A diameter of the rivet may be about 500 µm to 700 µm. The rivet may have a diameter about half of the width of the opening or greater. The rivet may be structured to extend straight to the bottom of the opening. The rivet may be riveted to a second portion of the clip. The second portion may extend to a terminal. The second portion may be formed by a metal sheet. The second portion may have a rectangular cross section. The second portion may have a cross section area corresponding to a cross section area of the rivet.

A clip as described herein may comprise a first portion formed integrally with the second portion. The first portion and the second portion may be formed by one piece of metal sheet which may be a copper sheet. The clip may be bent for the first portion and the second portion being about rectangular to each other. The clip may have a rectangular cross section. The first portion may have a square cross section. A width of the first portion may be about 200 µm, greater than 300 µm, greater than 500 µm or greater. A width of the first portion may be about 500 µm to 700 µm. The first portion may have a width about half of the width of the opening or greater. The first portion may be structured to extend straight to the bottom of the opening. The second portion may extend to a terminal. The second portion may have a rectangular cross section. The second portion may have a cross section area corresponding to a cross section area of the first portion. The second portion may have a varying cross section.

Examples disclosed herein may comprise a semiconductor device comprising a clip. The first portion of the clip may extend into the opening. The opening may comprise an electrically conductive adhesive at the bottom. The adhesive may attach the clip to the bottom. The adhesive may provide an electrical connection between a pad arranged at the bottom of the opening and the clip. The adhesive may be a solder. The adhesive may be an electrically conductive paste.

It is to be understood that all details given above may apply to the examples discussed below with reference to the figures and any example dimensions or materials given below are to be understood as mere examples not limiting the disclosure.

FIGS. 1A-1H are conceptual diagrams illustrating an example method for processing a semiconductor wafer according to an example.

FIG. 1A illustrates a cross section of a semiconductor wafer 10. The semiconductor wafer 10 according to this example may be a SiC (silicon carbide) wafer. Wafer 10 comprises a first main surface 12 and a second main surface 14 opposite the first main surface 12. The SiC wafer according to the example may be a 6 inch-wafer having a diameter of 150 mm. The wafer may have a thickness $t_w$ of about 500 µm between the first main surface 12 and the second main surface 14.

Figure 1B:
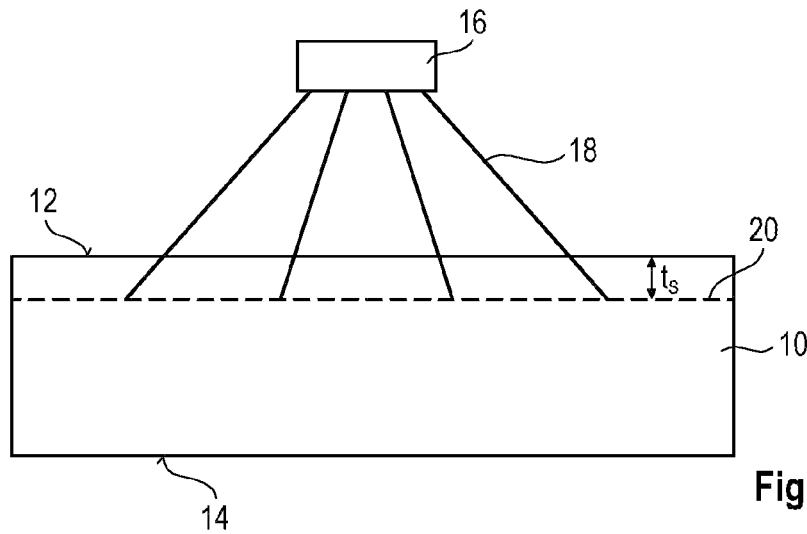

FIG. 1B shows the semiconductor wafer 10 and a radiation source 16 arranged above the first main surface 12. The radiation source 16 according to this example exposes the wafer 10 to laser rays 18. The laser rays 18 may be configured to create defects inside the semiconductor wafer 10 in a well-defined depth. The well-defined depth may take into account later splitting losses. The laser rays 18 may be focused to create the defects in the well-defined depth. The defects created in a same depth may define a detachment plane 20. The detachment plane 20 is generally parallel to the first main surface 12. A distance is between the first main surface 12 and the detachment plane 20 may comprised between about 50 µm and 100 µm. A distance is between the first main surface 12 and the detachment plane 20 may comprised between about 50 µm.

Figure 1C:
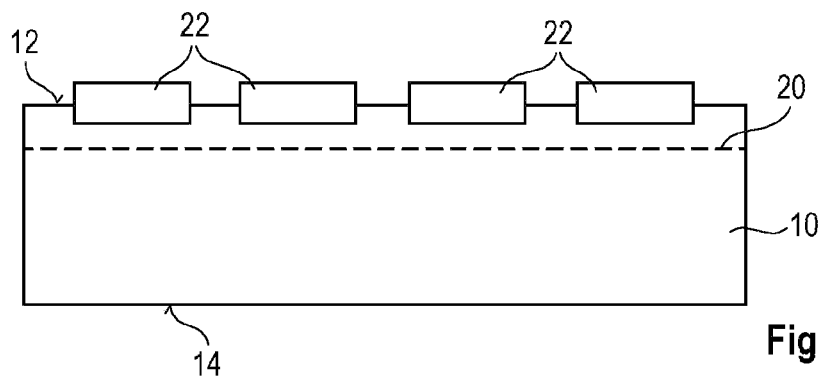

FIG. 1C illustrates processing at the first main surface 12 of wafer 10 to form semiconductor components 22. Processing may include any front end processes required to form semiconductor components 22. This may include deposition, etching, implanting, growing, doping, diffusion and so on. While FIG. 1C just shows 4 components it is to be understood that wafer 10 may include much more components 22. Parts of the semiconductor components 22 may extend above the first main surface 12. Parts of the semiconductor components 22 may extend in the semiconductor body between the first main surface 12 and the detachment plane 20. Semiconductor components 22 may be separated by kerf lines not shown in FIG. 1C. Semiconductor components 22 may comprise contact pads on the first main surface 12.

Figure 1D:
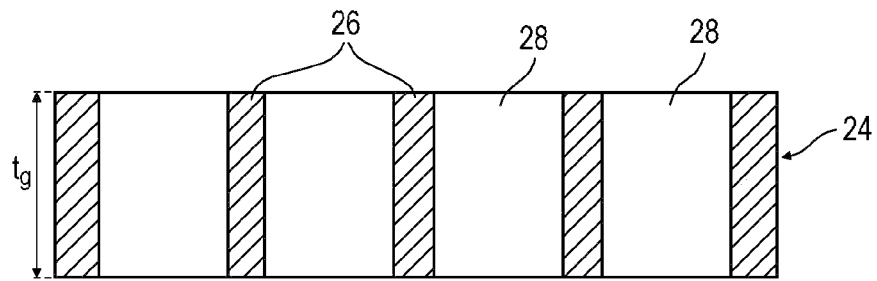

FIG. 1D shows a schematic cross section of a glass structure 24. Glass structure 24 may be a glass grid. Glass structure 24 may comprise glass bars 26 with openings 28 in-between. A thickness $t_g$ of glass structure 24 may be about 500 µm in the present example. A width of openings 28 may be between about 1 mm and 1.5 mm in the present example.

Figure 1E:
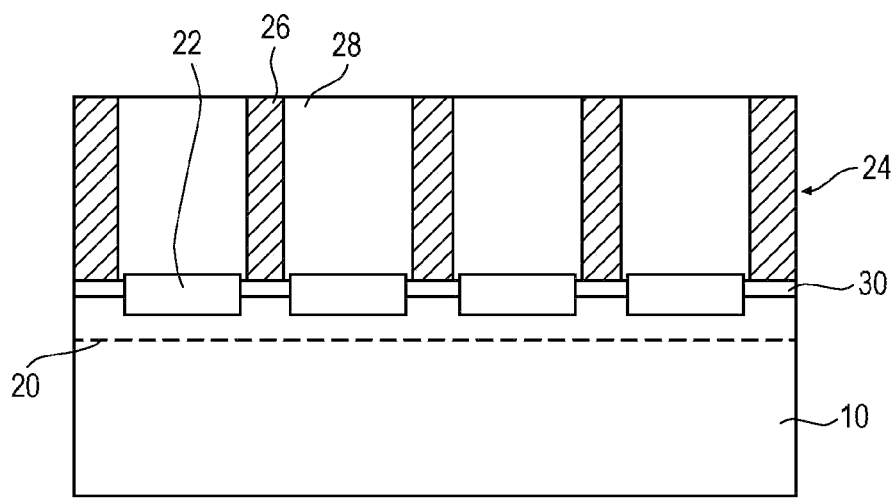

FIG. 1E shows the glass structure 24 irreversibly attached to wafer 10 by an adhesive 30. Glass structure 24 may be aligned to processed wafer 10 to leave the semiconductor components 22 uncovered. In other words, openings 28 may be above at least parts of semiconductor components 22. Openings 28 may leave contact pads of the semiconductor components 22 uncovered. Bars 26 may be arranged on top of the kerf lines and along the kerf lines separating the semiconductor components 22. There may be more than one opening 28 per semiconductor component. For example, in a case where the semiconductor component 22 comprises two contact pads on the first main surface of the wafer 10, there may be a separate opening 28 for each contact pad.

Figure 1F:
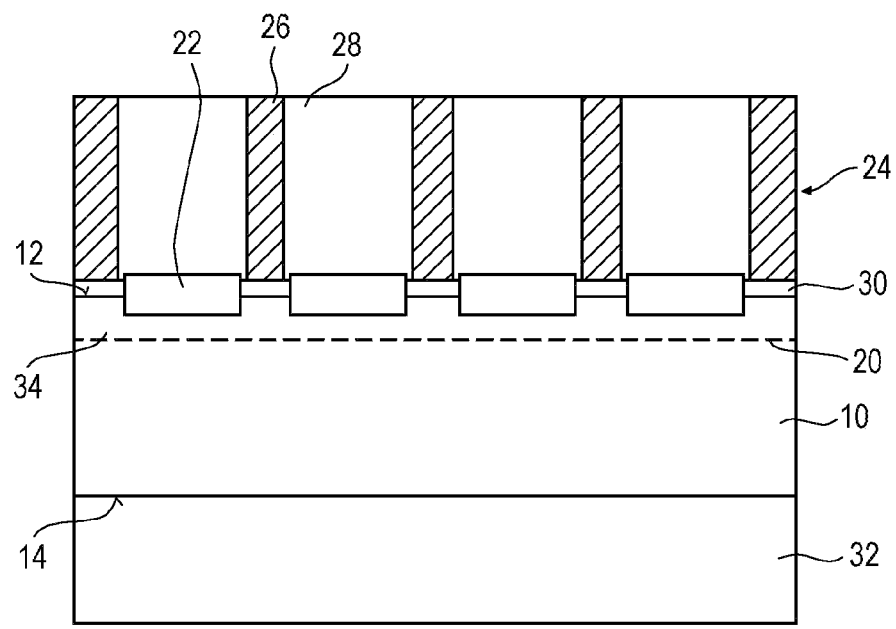

FIG. 1F illustrates preparation for splitting the processed semiconductor slice from the wafer. A polymer layer 32 is applied onto the second main surface 14 of wafer 10. The polymer layer may have a thermal coefficient that is higher by about two orders of magnitude compared to the semiconductor wafer. In an example, a further polymer layer (not shown) may be applied onto the first main surface 12. The assembly comprising wafer 10, glass structure 24 and the polymer layer may then be cooled down. Cooling may go down to a temperature below a glass transition temperature of the polymer layer. Cooling down may go to a temperature below 0° C. Cooling may go below −10° C., below −100° C., below −150° C., below −170° C. or even lower. Cooling may for example be achieved by means of liquid nitrogen. Glass transition changes physical properties of the polymer layer and applies stress to the wafer. Using glass transition allows achieving a relatively high elasticity modulus so that sufficiently large stresses can be induced. This stress leads to crack propagation in the detachment layer and subsequently to splitting a slice 34 off the wafer. Glass structure 24 stabilizes slice 34 during split-off. An optional additional polymer layer on glass structure 24 during splitting may further stabilize. An optional additional polymer layer on glass structure 24 during splitting may further enforce crack propagation. The slice extends between the first main surface 12 and the detachment layer 20. The semiconductor slice 34 comprises the processed semiconductor part of wafer 10.

Figure 1G:
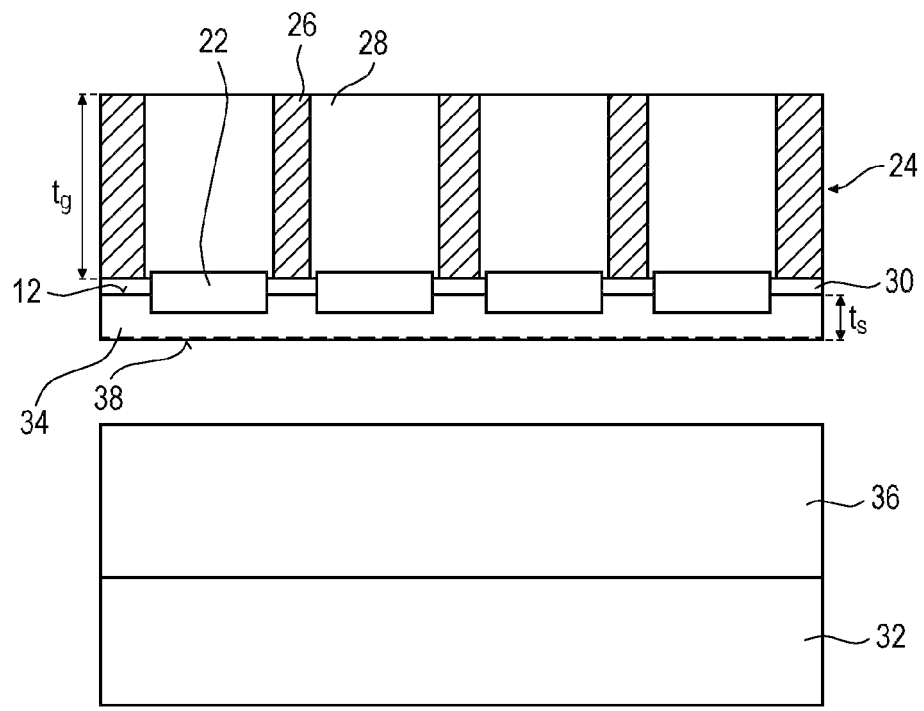

FIG. 1G shows the semiconductor slice 34 split off from the remaining semiconductor wafer 36. Polymer layer 32 may be detached from the remaining semiconductor wafer 36. This may be effectuated for example by etching. The remaining semiconductor wafer may be still sufficiently thick, for example with a starting wafer thickness of 350 µm and a slice thickness of 50 µm, to restart the method as explained with reference to FIGS. 1A-1G again with the remaining wafer 36 as semiconductor wafer 10. Therefore, with a same wafer a plurality of processed semiconductor slices may be produced. Sawing losses may be minimized A backside 38 from semiconductor slice 34 may be grinded or etched or processed in any other form to release any remaining damages from the split process. The permanently attached glass grid 24 stabilizes the thin semiconductor slice 34. The thickness $t_g$ of glass structure 24 may be at least four times the thickness $t_s$ of semiconductor slice 34. The thickness $t_g$ of glass structure 24 may be ten times the thickness $t_s$ of semiconductor slice 34. Thickness $t_g$ may be 500 µm with the thickness $t_s$ being 50 µm.

Figure 1H:
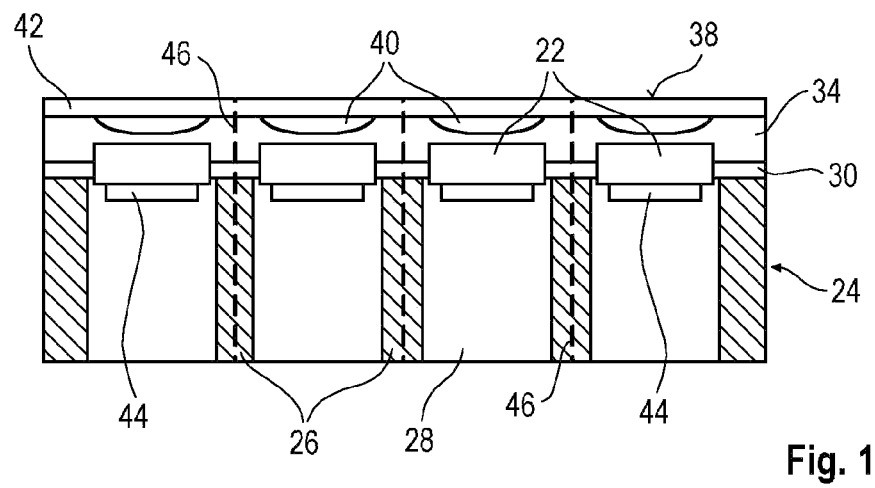

FIG. 1H shows the assembly comprising glass structure 24 and semiconductor slice 34 turned by 180° compared to FIG. 1G. FIG. 1H illustrates further backside processing steps to finalize semiconductor components 22. Backside processing may comprise implantation processes to form doped example regions 40. Backside processing may comprise any annealing steps. Backside processing may comprise forming of metallization structures 42, for example contact pads, connection lines and so on. Glass structure 24 may be thinned after splitting. It is also possible to form metallization structures 44 on the front side 12 of semiconductor slice 34, i.e. inside openings 28 at this stage that is after splitting the slice off the wafer. Metallization structures 44 may also be formed at an earlier stage. Metallization structures 44 may be formed during front side processing. When both front side 12 and backside 38 are provided with contact pads 42, 44 semiconductor components 22 may be electrically tested. Electrical measurement may thus be possible on wafer level. Glass structure 24 stabilizes the wafer during testing but leaves contact pads 44 accessible. There is no need for an additional carrier. After testing, semiconductor slice 34 along with glass structure 24 may be separated into individual semiconductor dies. Singulation may be effectuated by sawing along kerf lines 46. Any other dicing method may be used.

Figure 2:
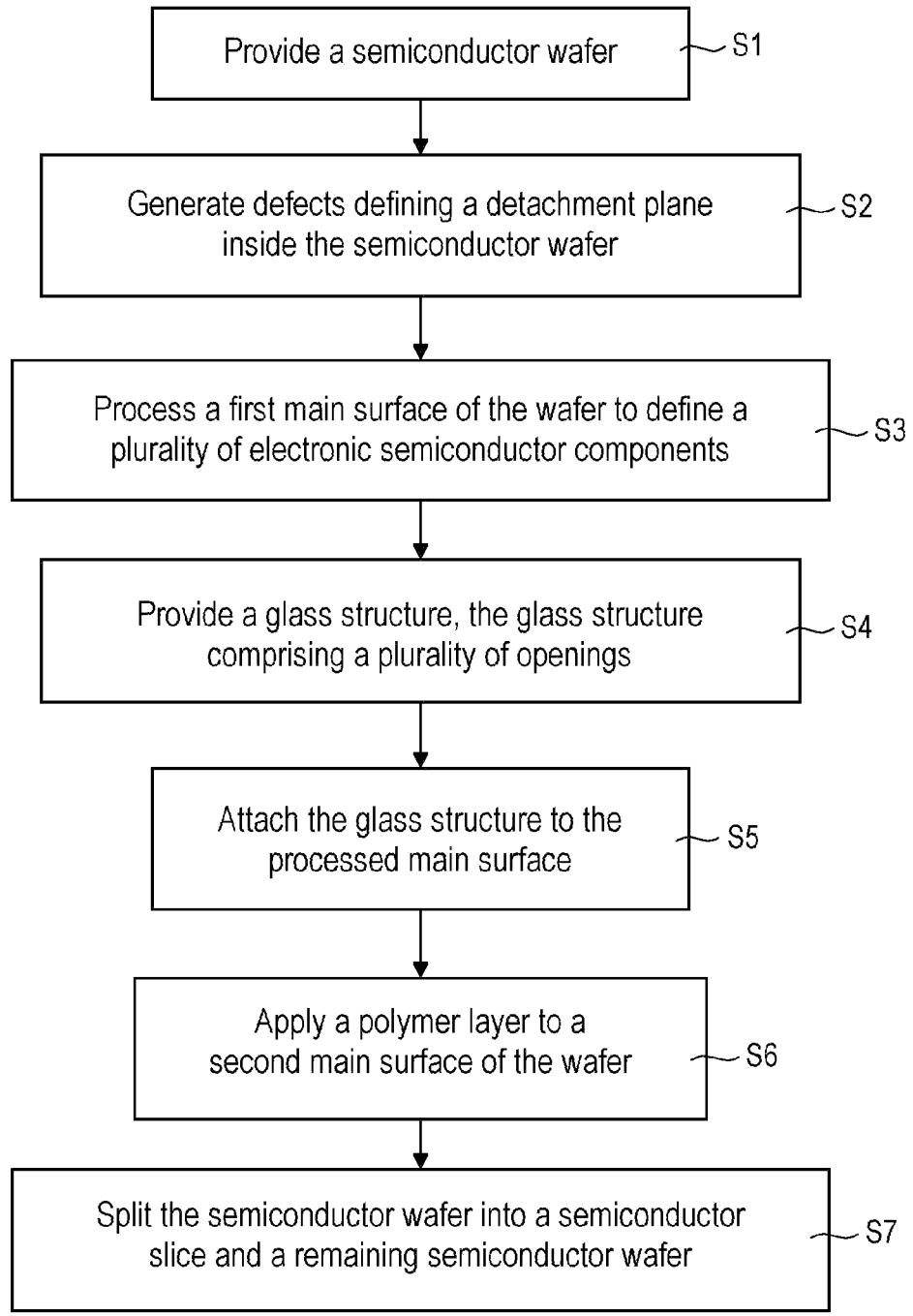
FIG. 2 is a flow diagram of an example method for processing a semiconductor wafer according to an example.

FIG. 2 is a flow diagram for an example method for processing a semiconductor wafer according to an example. At S1 a semiconductor wafer is provided. At S2 defects are generated by means of a laser, preferably a femtosecond laser with pulses less than 500 fs. The defects are generated inside the semiconductor wafer. The defects are located on one plane defining a detachment plane parallel to a surface of the semiconductor wafer. At S3 a first main surface of the wafer is processed to define a plurality of electronic semiconductor components. At S4 a glass structure is provided. The glass structure comprises a plurality of openings extending from a first surface of the glass structure to a second surface of the glass structure opposite the first surface. The glass structure may comprise one opening per semiconductor component or more than one opening per semiconductor component. At S5 the glass structure is permanently attached to the processed first main surface of the semiconductor wafer. Attachment is effectuated so to withstand temperatures going from about 300° C. to −170° C. At S6 a polymer layer is applied to a second main surface of the wafer opposite the first main surface. The polymer may have a glass transition temperature. At S7 the semiconductor wafer is split into a semiconductor slice comprising the processed first surface of the semiconductor wafer and a remaining semiconductor wafer. Splitting is effectuated by cooling the assembly down beneath the glass transition temperature to effectuate a cold-split.

Figure 3:
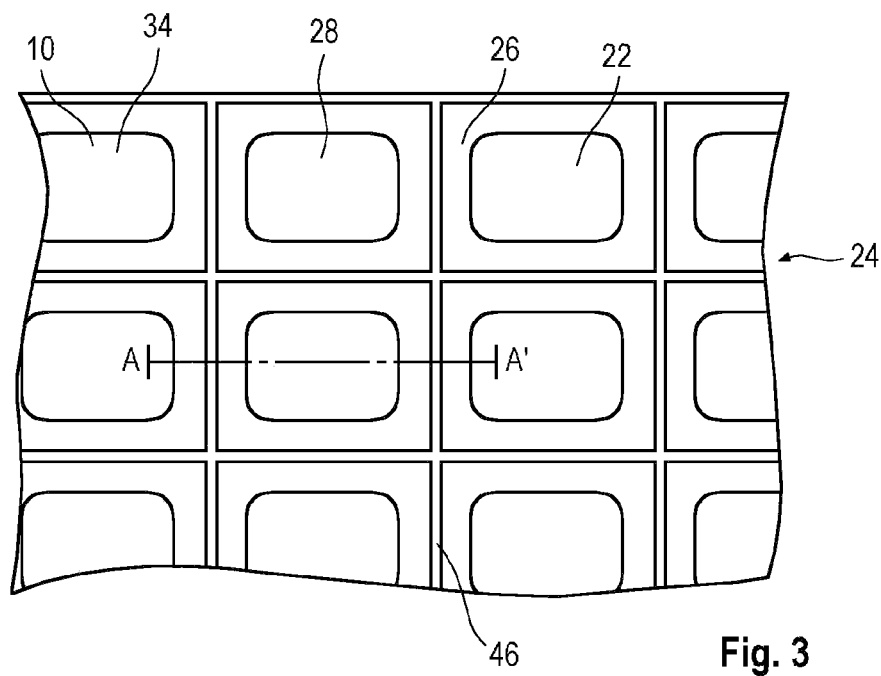
FIG. 3 is a conceptual top-down view onto a semiconductor wafer according to an example.

FIG. 3 is a conceptual top-down view onto a semiconductor wafer 10 or onto a semiconductor slice 34 with a glass structure 24 attached. The top-down view does not change after splitting. It shows the grid formed by a regular glass structure 24 delimiting the openings 28. At the bottom of the openings are the uncovered semiconductor components 22. The whole uncovered surface of one semiconductor component 22 may form a contact pad. On the uncovered surface of one semiconductor component 22 more than one contact pad may be formed (not shown). In the middle of bars 26 forming grid 24 are located kerf lines 46.

Figure 4A:
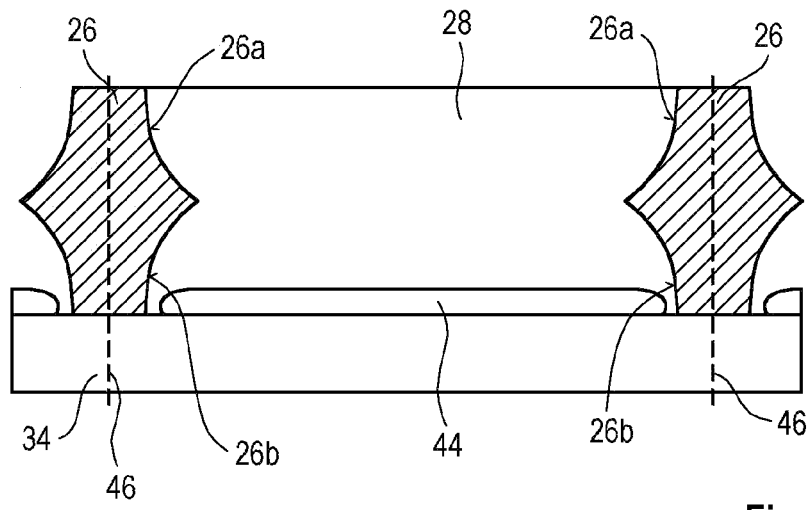
FIGS. 4A and 4B are conceptual cross views along line A-A' in FIG. 3 according to two different examples.

FIG. 4A is a conceptual cross view along line A-A' in FIG. 3 according to an example. On semiconductor slice 34 two bars 26 of glass structure 24 are shown. Between the two bars 26 a contact pad 44 is shown. Bars 26 show two concave surfaces 26a, 26b. These surfaces appear, when openings 28 are etched into the glass structure starting from the two surfaces using lithographic masks as explained above. A wet etch undercuts the mask and leads to a concave surface. The two concave surface parts limit an aspect ratio width/depth of openings 28. They are tolerable if the opening width is sufficiently larger than the depth of the opening. A resulting opening may be calculated by adding twice an etching depth to an initial opening.

Figure 4B:
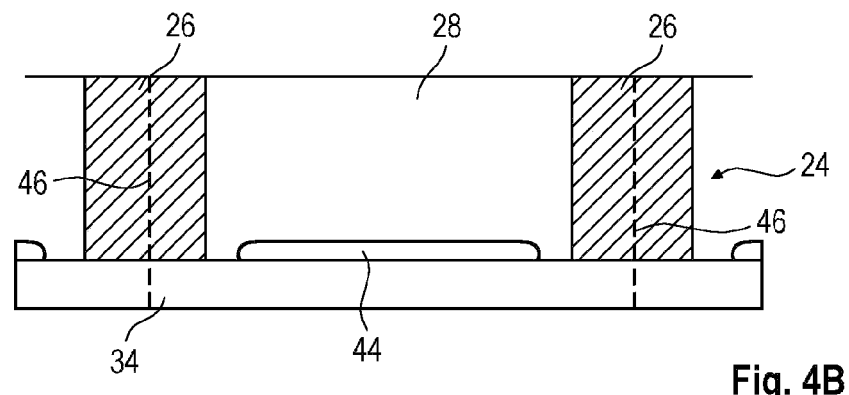

FIG. 4B is a conceptual cross views along line A-A' in FIG. 3 according to a different example. On semiconductor slice 34 two bars 26 of glass structure 24 are shown. Between the two bars 26 a contact pad 44 is shown. Bars 26 show straight vertical surfaces. In this example, openings 28 have been etched using the LIDE process explained above. A smaller aspect ratio width/depth of openings 28 can be achieved, i.e. for a same height of the glass structure (equal a depth of the opening) a smaller width of the opening may be achieved than with the wet etch process illustrated in FIG. 4A.

Figure 5:
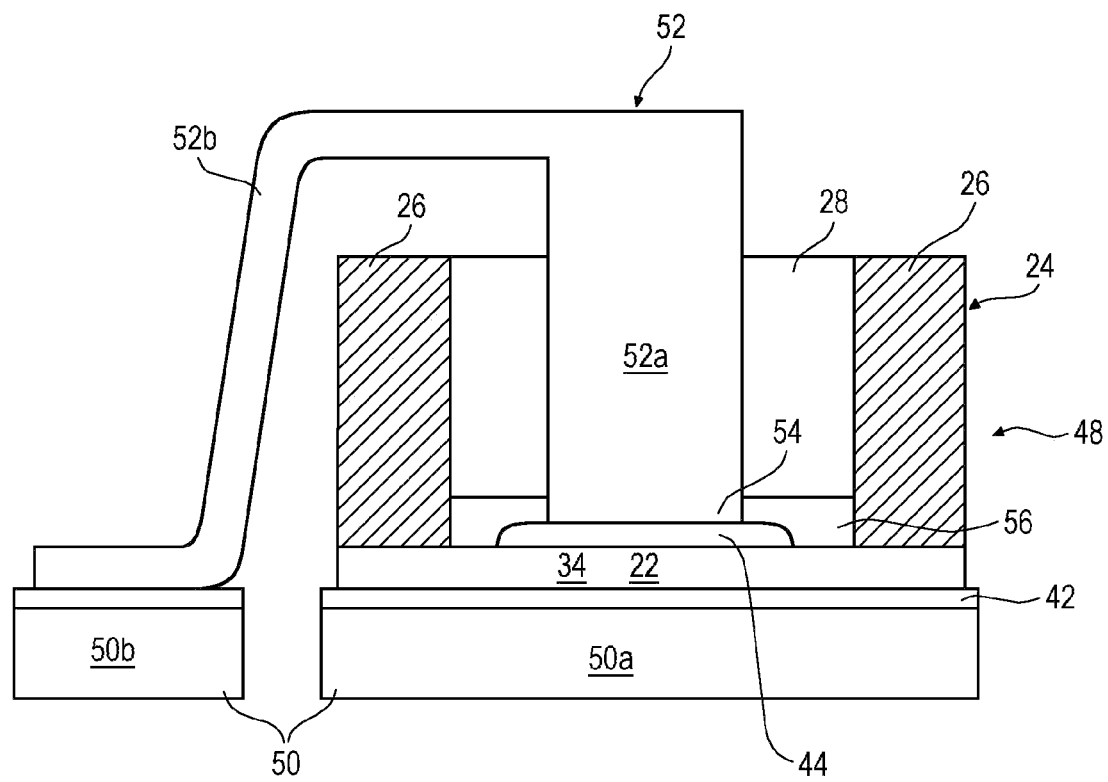
FIG. 5 is a conceptual cross view of a semiconductor device according to an example.

FIG. 5 is a conceptual cross view of a semiconductor device 48 according to an example. Semiconductor device 48 comprises a die obtained by dicing semiconductor slice 34. The die may comprise one electronic component 22. In the example shown, electronic component 22 may be a diode. A contact pad 44 may be arranged on top of electronic component 22 at the bottom of opening 28 and metallization 42 may be arranged at the backside. The cross view shows bars 26 of glass structure 24 to the left and right of contact pad 44. It is to be understood in view of FIG. 3 that glass structure 24 forms a rim completely surrounding contact pad 44 arranged at the bottom of opening 28.

Semiconductor device 48 further comprises a carrier 50 which may be a lead frame. Carrier 50 comprises a die pad 50a and a terminal 50b.

The metallization 42 of the die electrically and mechanically connects die pad 50a e.g. by solder or an electrically conductive paste. A schematically illustrated clip 52 has a first portion 52a and a second portion 52b. The first portion 52a may have a length greater than the thickness of glass structure 24. A first end 54 of the first portion 52a is electrically connected to contact pad 44 by means of an adhesive 56 at the bottom of opening 28. The adhesive may be a solder or an electrically conductive paste. The second portion 52b may be structured to extend to the terminal 50b. The structure of the second portion 52b may depend on the carrier used. For example, the carrier may have a terminal on another level than the die pad.

Figure 6A:
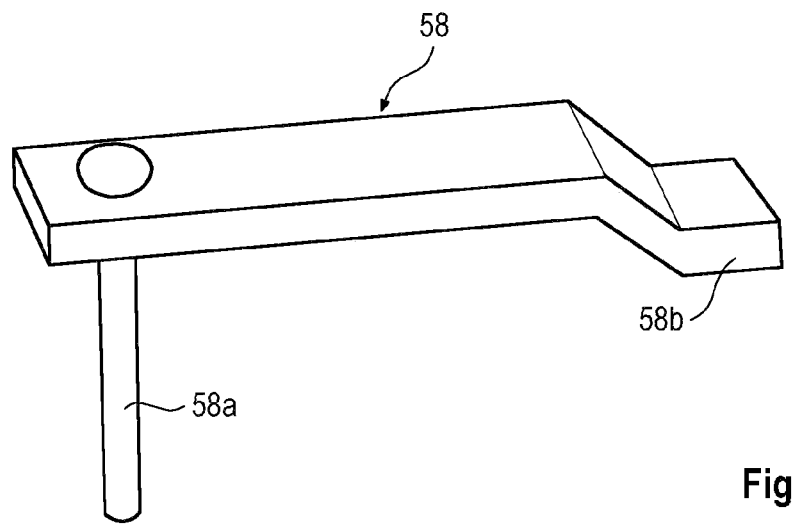
FIG. 6A is a conceptual perspective view of a clip comprising a rivet according to an example.

FIG. 6A is a conceptual perspective view of a clip 58 comprising a rivet according to an example. Clip 58 may comprise a first portion 58a and a second portion 58b. The first portion 58a may be formed by a rivet riveted to second portion 58b. Clip 58 may be made of copper. A diameter of rivet 58a may be scalable to conform to a contact pad to be contacted. For example, the contact pad may be a source contact. A diameter of rivet 58a may be scalable to conform to a current to pass the clip. Second portion 58b may be stamped from a metal sheet. Second portion 58b may have a scalable upper surface area dependent on the current to pass the clip. Second portion 58b may have a scalable upper surface area dependent on an ON-resistance requirement. ON resistance is the resistance value between source and drain of a MOSFET transistor. Second portion 58b may be bent to adapt to a carrier terminal. Second portion 58b may comprise an opening through which rivet 58a passes.

Figure 6B:
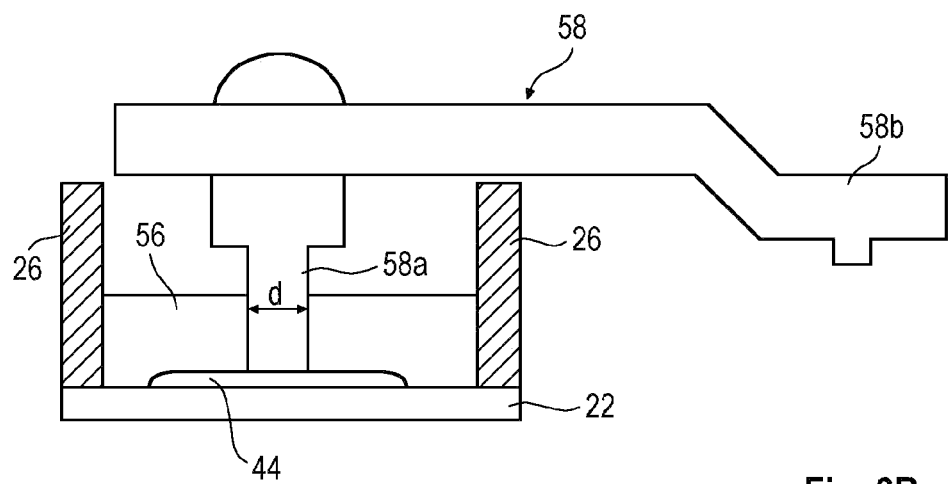
FIG. 6B is a conceptual cross view of a clip comprising a rivet according to an example.

FIG. 6B is a conceptual cross view of clip 58 connected to pad 44 of an example semiconductor device. The semiconductor device comprises the semiconductor component 22 with glass structure 24 surrounding opening 28. Rivet 58a passes straight into opening 28. Rivet 58a is not bent. To fix rivet 58a, the opening 28 may be partly filled with an adhesive 56. Adhesive 56 may be an electrically conductive paste. Adhesive 56 may be a solder. Rivet 58a may extend into the adhesive. There may be no need to bend or to exert any force on the clip when attaching to the pad 44. A diameter d may be about 500 to 700 µm. A distance between a surface of pad 44 and an upper surface of second portion 58b may be about 1.25 to 1.3 mm Clip 58 combines a long vertical dimension for a small contact with a wide clip surface area. By riveting the vertical first portion 58a to the second large portion 58b it is possible to insert the clip into a small bond pad opening 28 surrounded by a high glass structure, or a high rim. It may not be possible to contact pad 44 by bond wire if the depth/width aspect ratio of opening 28 is too great. Clip 58 may easily be adapted to current, ON resistance and package design requirements.

Figure 7A:
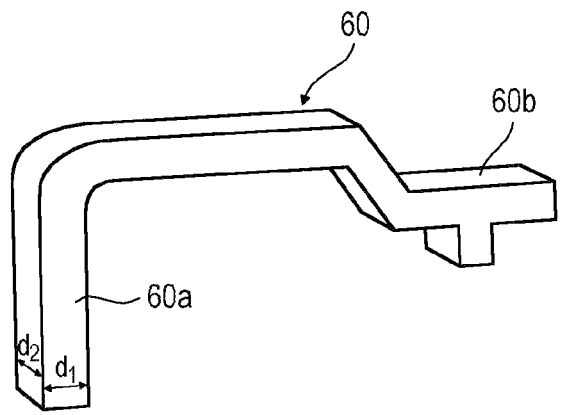
FIG. 7A is a conceptual perspective view of a bent clip according to an example.

FIG. 7A is a conceptual perspective view of a bent clip 60 according to an example. Clip 60 may comprise a first portion 60a and a second portion 60b. First and second portions may be integrally formed from a metallic sheet. The metallic sheet may be a copper sheet. A length d1 and a width d2 of a cross section of first portion 60a may be adapted to a surface of a pad to be contacted. Length d1 and width d2 may be about 500 to 700 µm. A cross section d1×d2 may correspond to a surface p1×p2 of the pad. A cross section of the first portion 60a may be the same as a cross section of the second portion 60b. First portion 60a may combine a long vertical dimension with a small source contact.

Figure 7B:
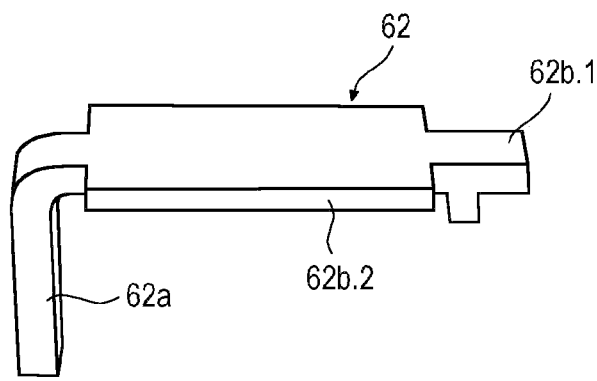
FIG. 7B is a conceptual perspective view of a bent clip according to an example.

FIG. 7B is a conceptual perspective view of a bent clip 62 according to an example. Clip 62 differs from clip 60 in that a cross section of the first portion 62a may not be the same as a cross section of the second portion 62b. Second portion 62b may comprise a part 62b.1 with a cross section which may be the same as the cross section of the first portion 62a. Part 62b.1 may connect to a terminal. Second portion 62b may comprise a part 62b.2 which may be larger than the first portion 62a and larger than the first part 62b.1. Part 62b.2 may be a scalable surface area. The scalable surface area may be achieved e.g. by stamping or etching. The area is not limited by another method.

Figure 7C:
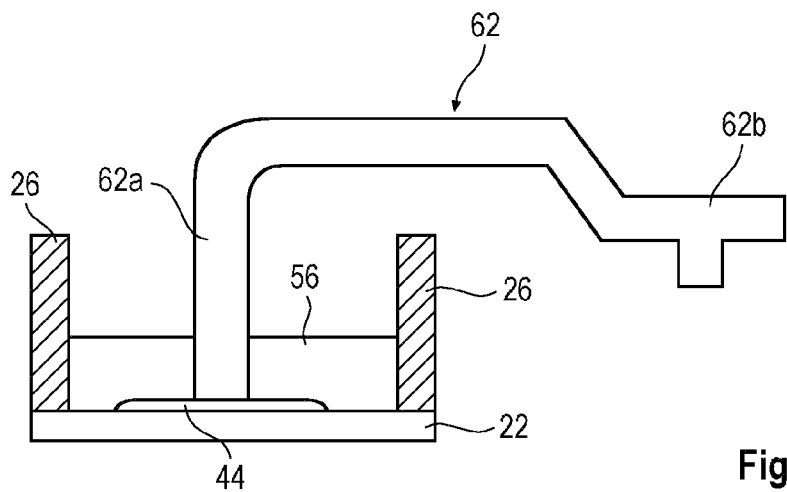
FIG. 7C is a conceptual cross view of a bent clip attached to an example semiconductor device according to an example.

FIG. 7C is a conceptual cross view of clip 60 or clip 62 connected to pad 44 of an example semiconductor device. The semiconductor device comprises the semiconductor component 22 with glass structure 24 surrounding opening 28. First portion 62a (or 60a) passes straight into opening 28. To fix first portion 60a, 62a the opening 28 may be partly filled with an adhesive 56. Adhesive 56 may be an electrically conductive paste. Adhesive 56 may be a solder. First portion 60a, 62a may extend into the adhesive. There may be no need to bend or to exert any force on the clip 60, 62 when attaching to the pad 44. Clips 60, 62 combine a long vertical dimension for a small contact with a wide clip surface area. It is possible to insert the clip into a small bond pad opening 28 surrounded by a high glass structure, or a high rim. Clips 60, 62 may easily be adapted to current, ON resistance and package design requirements.

In the following the method for processing a semiconductor wafer and the semiconductor wafer, semiconductor device and the clip are further described using particular examples.

Example 1 is a method for processing a semiconductor wafer comprising: providing a semiconductor wafer comprising a first main surface and a second main surface opposite the first main surface, generating defects inside the semiconductor wafer, the defects defining a detachment plane parallel to the first main surface, processing the first main surface to define a plurality of electronic semiconductor components, providing a glass structure, the glass structure comprising a plurality of openings, attaching the glass structure to the processed first main surface, each of the plurality of openings leaving a respective area of the plurality of electronic semiconductor components uncovered, applying a polymer layer to the second main surface, splitting the semiconductor wafer into a semiconductor slice and a remaining semiconductor wafer by cooling the polymer layer beneath its glass transition temperature, the semiconductor slice extending between the first main surface and the detachment plane and comprising the plurality of electronic semiconductor components.

Example 2 is the method of example 1 further comprising applying a further polymer layer to the first main surface prior to splitting the semiconductor slice from the semiconductor wafer.

Example 3 is the method of example 1, wherein a thickness of the semiconductor slice is about or less than 100 µm and preferably about or less than 50 µm.

Example 4 is the method of example 1, wherein a thickness of the glass structure is at least four times the thickness of the semiconductor slice.

Example 5 is the method of example 1, wherein the plurality of electronic components is separated by kerf lines, the kerf lines being covered by the glass structure.

Example 6 is the method of example 5, further comprising dividing the semiconductor slice with the attached glass structure along the kerf lines into semiconductor chips.

Example 7 is the method of example 1, further comprising electrically connecting a clip to a pad, the pad arranged in the respective area on the first main surface uncovered by the glass structure.

Example 8 is the method of example 7, the clip comprising a first portion having a length greater than the thickness of the glass structure connecting to the pad; and a second portion structured to extend to a terminal.

Example 9 is the method of example 8, the clip comprising at least one of a rivet forming the first portion riveted to the second portion and a single piece bent to form both the first and the second portion.

Example 10 is the method of example 7, wherein connecting the clip to the pad comprises filling an adhesive into the respective opening of the glass structure.

Example 11 is the method of example 1, further comprising restarting the method with the remaining semiconductor wafer as semiconductor wafer.

Example 12 is a semiconductor wafer comprising a first main surface and a second main surface opposite the first main surface, a detachment plane parallel to the first main surface inside the semiconductor wafer, the detachment plane defined by defects, a plurality of electronic semiconductor components formed at the first main surface and between the first main surface and the detachment plane, a glass structure attached to the first main surface, the glass structure comprising a plurality of openings, each of the plurality of openings leaving a respective area of the plurality of electronic semiconductor components uncovered.

Example 13 is a clip for electrically connecting a pad arranged on a bottom of an opening in a glass structure, the clip comprising at least one out of a rivet forming a first portion of the clip, the rivet riveted to a second portion of the clip, and a single piece of metal sheet bent to form both a first and a second portion, wherein the second portion is structured to extend to a terminal, and the first portion has a width about half of the width of the opening or greater and is structured to extend straight to the bottom of the opening.

Example 14 is a semiconductor device comprising a semiconductor chip with a first main surface and a second main surface opposite the first main surface, the first main surface comprising a pad and a glass structure comprising an opening, a rim of the opening surrounding the pad, wherein an aspect ratio between a thickness of the glass structure surrounding the opening and a width of the opening being one to three or greater, a carrier, the semiconductor chip being mounted on the carrier with the second main surface facing the carrier, an adhesive on a bottom of the opening, a clip electrically connecting the pad, the clip comprising at least one out of, a rivet forming a first portion of the clip, the rivet riveted to a second portion of the clip, and a single piece bent to form both a first and a second portion, wherein the second portion is structured to extend to a terminal on the carrier, and the first portion is structured to extend straight to the bottom of the opening, the first portion has a width about half of the width of the opening or greater and is electrically connected to the pad by means of the adhesive.

Example 15 is the semiconductor device of example 14, wherein the semiconductor chip is a vertical power component.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for processing a semiconductor wafer, the method comprising:
   providing a semiconductor wafer comprising a first main surface and a second main surface opposite the first main surface;
   generating defects inside the semiconductor wafer, the defects defining a detachment plane parallel to the first main surface;
   processing the first main surface to define a plurality of electronic semiconductor components;
   providing a glass structure, the glass structure comprising a plurality of openings;
   attaching the glass structure to the processed first main surface, each of the plurality of openings leaving a respective area of the plurality of electronic semiconductor components uncovered;
   applying a polymer layer to the second main surface;
   splitting the semiconductor wafer into a semiconductor slice and a remaining semiconductor wafer by cooling the polymer layer beneath a glass transition temperature of the polymer layer, the semiconductor slice extending between the first main surface and the detachment plane and comprising the plurality of electronic semiconductor components.

2. The method of claim 1, further comprising applying a further polymer layer to the first main surface prior to splitting the semiconductor slice from the semiconductor wafer.

3. The method of claim 1, wherein a thickness of the semiconductor slice is about or less than 100 µm.

4. The method of claim 1, wherein a thickness of the semiconductor slice is about or less than 50 µm.

5. The method of claim 1, wherein a thickness of the glass structure is at least four times a thickness of the semiconductor slice.

6. The method of claim 1, wherein the electronic components are separated by kerf lines, and wherein the kerf lines are covered by the glass structure.

7. The method of claim 6, further comprising dividing the semiconductor slice with the attached glass structure along the kerf lines into semiconductor chips.

8. The method of claim 7, wherein the glass structure forms a rim completely surrounding the respective area of the plurality of electronic semiconductor components.

9. The method of claim 1, further comprising electrically connecting a clip to a pad, the pad arranged in the respective area on the first main surface uncovered by the glass structure.

10. The method of claim 9, wherein the clip comprises:
    a first portion having a length greater than a thickness of the glass structure connecting to the pad; and
    a second portion structured to extend to a terminal.

11. The method of claim 9, wherein the clip further comprises a rivet forming the first portion riveted to the second portion.

12. The method of claim 9, wherein the clip further comprises a single piece bent to form both the first portion and the second portion.

13. The method of claim 9, wherein electrically connecting the clip to the pad comprises filling an adhesive into the respective opening of the glass structure.

14. The method of claim 1, further comprising restarting the method with the remaining semiconductor wafer as the semiconductor wafer.

15. The method of claim 1, wherein the defects are generated by a radiation source.

16. The method of claim 1, wherein the plurality of openings have vertical sidewalls.

* * * * *